United States Patent [19]

Shimasaki et al.

[11] Patent Number: 5,363,046
[45] Date of Patent: Nov. 8, 1994

[54] SPARK PLUG CAP WITH MISFIRE DETECTING CAPACITOR FOR INTERNAL COMBUSTION ENGINE

[75] Inventors: Yuichi Shimasaki; Shigeru Maruyama; Masaki Kanehiro; Takashi Hisaki; Shigeki Baba; Takuji Ishioka, all of Saitama, Japan

[73] Assignee: Honda Giken Kogyo Kabushiki Kaisha, Tokyo, Japan

[21] Appl. No.: 12,524

[22] Filed: Feb. 2, 1993

[30] Foreign Application Priority Data

Feb. 6, 1992 [JP] Japan .................. 4-056395

[51] Int. Cl.5 .................. F02P 17/00; F23Q 23/00; G01R 19/00
[52] U.S. Cl. .................. 324/402; 324/126; 324/393
[58] Field of Search .......... 324/126, 393, 395, 399, 324/400, 402; 73/116

[56] References Cited

U.S. PATENT DOCUMENTS

| | | | |
|---|---|---|---|
| 2,181,149 | 11/1939 | Peters et al. | 324/402 X |
| 3,390,331 | 6/1968 | Brown et al. | 324/126 X |
| 3,538,440 | 11/1970 | Galloway | 324/126 X |
| 3,657,650 | 4/1972 | Arndt | 324/126 |
| 4,013,334 | 3/1977 | Behnke | 324/402 X |
| 4,306,187 | 12/1981 | Kinder | 304/402 X |

FOREIGN PATENT DOCUMENTS

| | | | |
|---|---|---|---|
| 52-118135 | 10/1977 | Japan . | |
| 3-326509 | 11/1991 | Japan . | |
| 1137154 | 12/1968 | United Kingdom | 324/402 |

Primary Examiner—Gerard R. Strecker
Attorney, Agent, or Firm—Nikaido, Marmelstein, Murray & Oram

[57] ABSTRACT

A spark plug cap having a capacitor for detecting ignition voltage of an internal combustion engine to determine if misfire occurs. The spark plug cap covers the terminal of a spark plug and has a conductor for carrying ignition voltage current from an ignition coil to spark plug terminals to generate an electronic spark between spark plug electrodes and an insulator surrounding the conductor. In the spark plug cap, a second conductor is located around the first conductor keeping a predetermined distance from the first conductor such that a capacitor, which constitutes a capacitance divider with a capacitor for ignition voltage detection, is formed between the first and the second conductors. A ceramic insulator may be positioned between the first and the second conductors to provide higher insulation property.

18 Claims, 7 Drawing Sheets

FIG. 7

SPARK PLUG CAP WITH MISFIRE DETECTING CAPACITOR FOR INTERNAL COMBUSTION ENGINE

BACKGROUND OF THE INVENTION

1. Field of the Invention

This invention relates to a technology for detecting misfire occurring during operation of a gasoline or other spark-ignition internal combustion engine and more particularly to a spark plug cap with a capacitor for detecting misfire for a spark-ignition internal combustion engine.

2. Description of the Prior Art

As is well known, in gasoline and other types of internal combustion engines a high voltage produced by an ignition coil is distributed to spark plug at the engine cylinders by an ignition distributor or the like. At each cylinder, the resulting electric discharge between the spark plug electrodes produces a spark which ignites an air-fuel mixture that has been drawn into the cylinder and compressed at the proper time, causing the mixture to burn explosively. In the course of this ignition-combustion process in the internal combustion engine, the mixture may for some reason occasionally fail to burn properly. This is referred to as a misfire. Misfires can result from causes in either the fuel system or the ignition system. Misfires caused by problems in the fuel system are the result of an overly lean or overly rich air-fuel mixture. A spark is produced between the spark plug electrodes but the air-fuel mixture does not ignite. Misfires caused by problems in the ignition systems are the result of spark plug electrodes fouling or ignition circuit malfunctions which prevent normal spark discharge.

The occurrence of misfire in the course of engine operation not only degrades engine performance but may also cause after-firing of unburned gases in the exhaust system, which can damage the exhaust gas aftertreatment system and have other adverse effects. Moreover, since the occurrence of even a single misfire indicates a misadjustment or malfunction in the fuel or ignition system, prompt elimination of the problem is essential. Because of this, there is a strong need for development of a detector for detecting misfires as soon as they occur.

Figure 7:
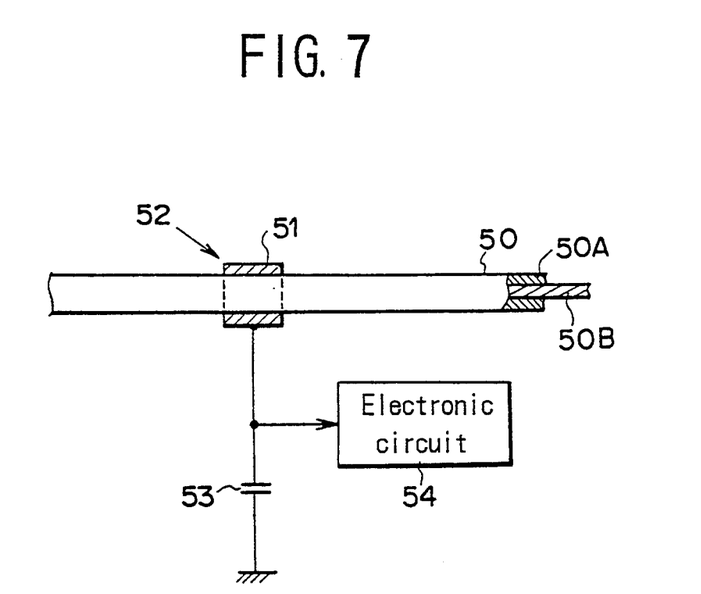
FIG. 7 is a schematic view showing the voltage detection means of a prior art misfire detector.

One type of misfire detector that has been proposed is the mis-spark detector described in Japanese Laid-open Patent Publication No. 52(1977)-118135. As shown in FIG. 7, the detector includes a conductor 51 wrapped around a portion of a high-voltage (high tension) cable 50 of the engine ignition system so as to constitute a detection capacitor 52 (a type of capacitance probe) in which the insulation cladding 50A of the high-voltage cable 50 serves as the dielectric. A voltage divider capacitor 53 is connected between the capacitor 52 and ground so that the ignition voltage (secondary voltage of the ignition coil) applied to the conductive core 50B of the high-voltage cable 50 induces a voltage across the terminals of the capacitor 52 owing to its static capacitance. The induced voltage is statically divided by the capacitor 52 and the capacitor 53, and the voltage across the terminals of the capacitor 53 (the divided voltage) is forwarded as a detection voltage to an electronic circuit 54 for processing and discrimination. The electronic circuit 54 discriminates the occurrence of misfires from the difference between the wave form of the ignition voltage at the time of normal spark discharge and that at the time of no spark discharge (missparking). Among the different types of misfires, the detector thus detects misfires that occur when no spark discharge is produced owing to a problem in the ignition system.

Another detector for detecting misfire in internal combustion engines is disclosed in the present assignee's Japanese Patent Application No. 3(1991)-326509. In this detector, the ignition voltage is similarly detected from a high-voltage cable or the like of the ignition system using static voltage division, and misfiring owing to causes in the fuel system is detected based on the fact that, even when spark discharge occurs, the wave form of the ignition voltage differs between the case where normal combustion occurs and the case where it does not.

In the conventional misfire detectors, as the means for detecting ignition voltage there is usually used a so-called capacitance probe constituted by wrapping a sheet or ribbon of conductor around the high-voltage cable of the ignition system so as to form a detection capacitor between the conductor and the core of the high-voltage cable via the insulation cladding of the high-voltage cable as the dielectric. However, the capacitance probe constituted in this manner has a major drawback that derives from the nature of the high-voltage cable of the ignition system. Because of its flexibility and elasticity, the high-voltage cable is highly susceptible to vibration. It is also easily affected by changes in the ambient humidity, wetting by leaking water, and fouling with oil, grime and the like. When a capacitor for use in detection is formed by wrapping a conductor ribbon around the cable, the static capacitance of the capacitor is apt to be changed from the proper value by shifting of the conductor caused by vibration as well as by changes in humidity, wetting with water and fouling with oil, grime and the like. Although some change in static capacitance can be tolerated if the capacitor is to be used only for checking the ignition voltage, even slight changes have to be avoided when it is used for misfire discrimination because such discrimination generally requires accurate detection not only of the ignition voltage but also of the ignition voltage wave form. The capacitance changes to which the prior art capacitance probe is susceptible degrade the detected voltage wave form and make it impossible to discriminate misfire with high reliability.

In actual practice, moreover, the flexibility and elasticity of the high-voltage cable make the work of attaching the conductor for forming the capacitor on the insulation cladding of the high-voltage cable difficult and troublesome. Maintenance of the so-formed capacitor is also troublesome.

In addition, the insulation cladding of the high-voltage cable is generally formed of synthetic rubber, a material that is readily degraded when exposed to heat and fouling with oil and grime. This degradation of the insulation cladding after the detection capacitor has been formed by winding the conductor around the high-voltage cord not only produces a progressive change in the static capacitance of the capacitor over time but may also reduce the electric insulation property of the cladding to the point that the high ignition voltage can leak to the conductor wrapped thereon. When this happens, the high leak voltage is apt to be conducted to the electronic circuitry of the misfire detector, which it can damage or cause to malfunction.

Ideally, moreover, for enabling accurate detection of the ignition voltage wave form, the distance between the conductor and the conductive core constituting the opposite sides of the detection capacitor should be made as small as possible so as to increase its static capacitance. In actuality, however, the conductor and the cable conductive core have to be spaced at a greater distance than desirable as a precaution against loss of the insulation property by the cable cladding owing to the aforesaid causes as well as to corona discharge. As a result, it has been impossible to avoid low accuracy in detecting the ignition voltage wave form.

SUMMARY OF THE INVENTION

This invention was accomplished in light of the foregoing circumstances and has as one object to provide a spark plug cap with a capacitor for detecting misfire for an internal combustion engine, which enables the static capacitance of the capacitor to be maintained constant, unaffected by mechanical vibration, humidity changes, water-wetting and the like, thus ensuring accurate detection of even the voltage wave form, and which is also easy to install and maintain.

Another object of the invention is to provide a spark plug cap with a misfire detecting capacitor which enables high accuracy detection of an ignition voltage wave form by improving the insulation property between the conductor and high-voltage conductor portions constituting the detection capacitor so as to enable reduction of the distance between the conductor and the high-voltage conductor portions.

For realizing these objects, the present invention provides a spark plug cap covering the terminal of a spark plug for an internal combustion engine and having a conductor for carrying ignition voltage current from an ignition coil to the spark plug terminal to generate an electric spark between spark plug electrodes and an insulator surrounding the conductor. In the cap, a second conductor is located around the first conductor keeping a predetermined distance from the first conductor such that a capacitor, which constitutes a capacitive divider with a capacitor for ignition voltage detection, is formed between the first and the second conductors.

BRIEF DESCRIPTION OF THE DRAWINGS

These and other objects and advantages of the invention will be more apparent from the following description and drawings, in which.

DETAILED DESCRIPTION OF THE PREFERRED EMBODIMENTS

Figure 1:
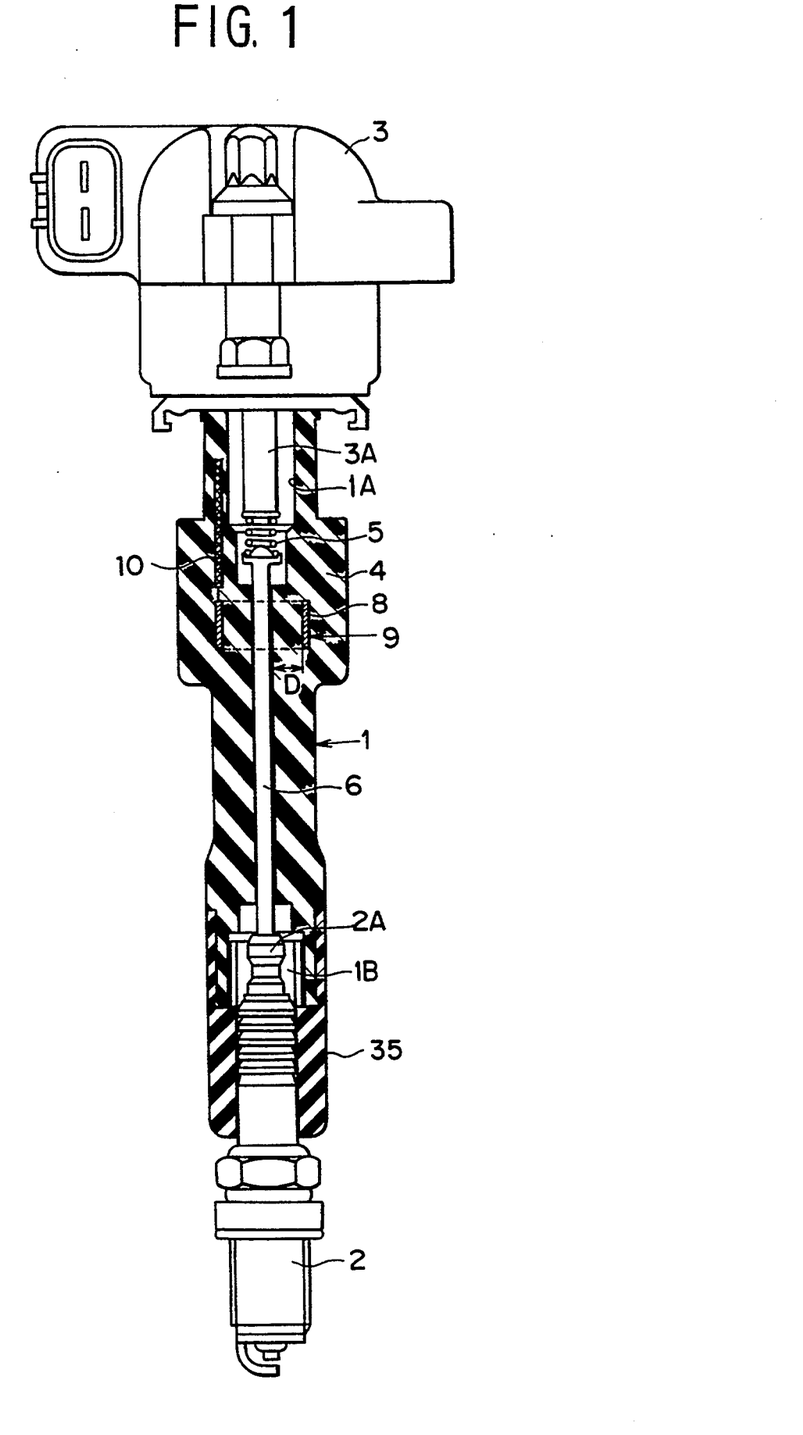
FIG. 1 is a side view partially in section of a spark plug cap with misfire detecting capacitor for an internal combustion engine according to a first embodiment of the invention.

In FIG. 1, a first embodiment of a spark plug cap 1 according to this invention is shown together with a spark plug 2 and an ignition coil unit 3.

As the spark plug cap 1 shown in FIG. 1 is for use in a distributorless ignition system (a direct ignition type system), it has the ignition coil unit 3 fixed on the upper end. The spark plug cap 1 is integrally formed in the overall shape of a hollow cylinder from polybutylene terephthalate (PBT) or other hard or rigid resin exhibiting excellent heat resistance and electrical insulation property. The integrally formed hard resin constitutes an insulator 4 to be explained later. The upper part of the hollow portion centered on the axis of the spark plug cap 1 constitutes an upper insertion chamber 1A into which a secondary output terminal 3A of the ignition coil unit 3 is inserted. The middle part of the hollow portion slidably accommodates a rod-shaped or shaft conductor 6 for high-voltage conduction. The upper end of the conductor 6 is electrically and mechanically connected with the secondary output terminal 3A of the ignition coil unit 3 through a conductive spring 5. The lower end of the hollow portion constitutes a cap chamber 1B which covers and is fixed to a terminal 2A at the top of the spark plug 2. The lower end of the conductor 6 contacts the terminal 2A of the spark plug 2. The conductor 6 receives high voltages for spark discharge from the secondary output terminal 3A of the ignition coil unit 3 and conducts them to the terminal 2A of the spark plug 2. The conductor 6 is enclosed by the hard resin insulator 4. And, the spark plug 2 is screwed firmly into a head of an internal combustion engine (not shown). Lower cover 35 engages the spark plug insulator as shown.

In addition to the features described in the foregoing, which are the same as those of the prior art spark plug cap, the embodiment of FIG. 1 is further provided with a conductor 8 for detection constituted of copper, aluminum or the like in the shape of a hollow tube, a half tube(s) or a split tube(s) and embedded-in the insulator 4.

Since the conductor 8 is integrally embedded in the insulator 4 at the time of its formation, a portion of the hard resin constituting the insulator 4 is present between the conductor 8 and the conductor 6. The conductor 8, the conductor 6 and the intervening insulator (dielectric) constitute a detection capacitor 9. A lead 10 is connected with the conductor 8 for enabling the detection voltage to be conducted to the exterior of the insulator 4.

Figure 2:
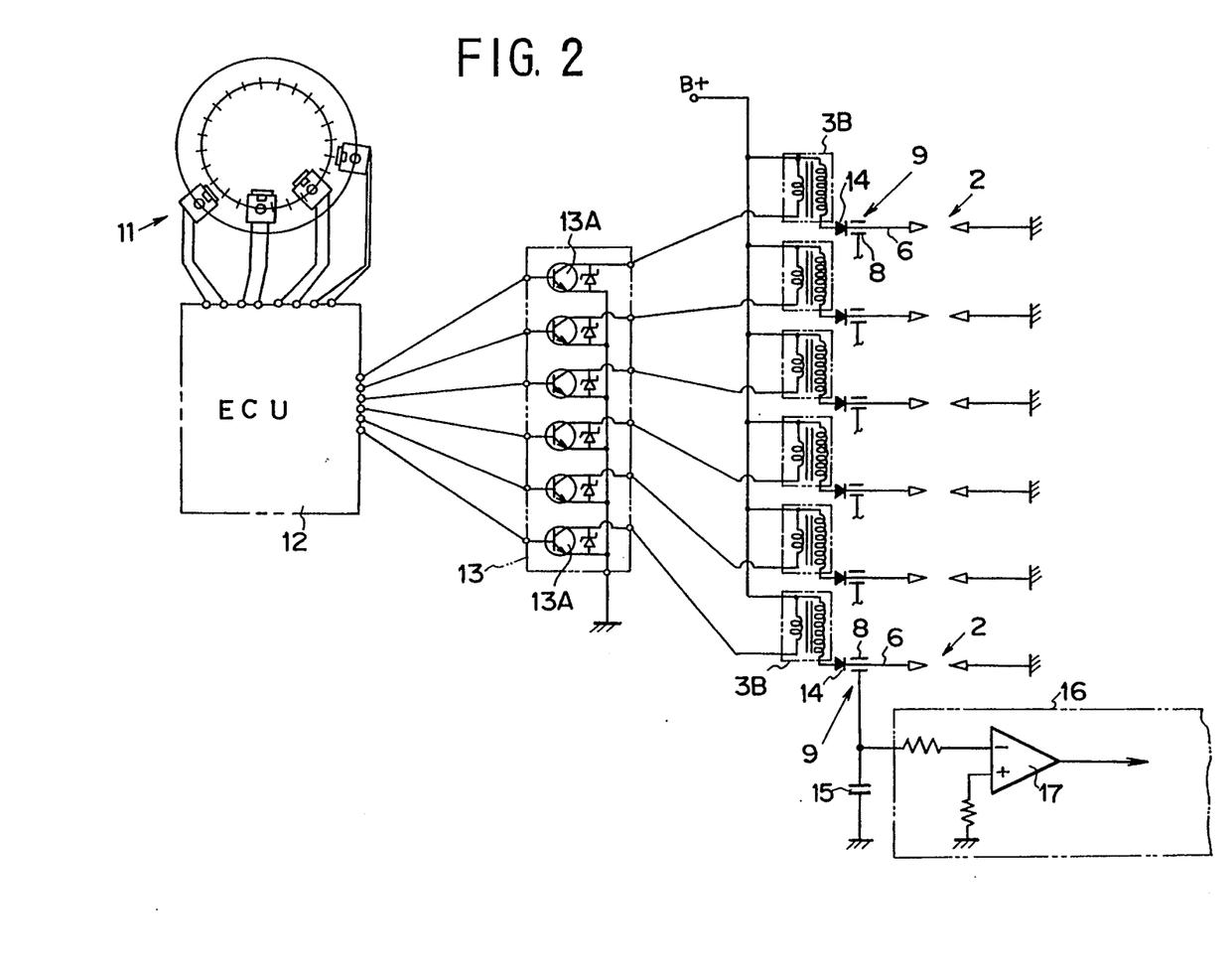
FIG. 2 is a wiring diagram showing the electrical circuitry of an ignition system utilizing the spark plug cap of FIG. 1.

FIG. 2 is a schematic diagram showing an example of the electric circuitry of a direct ignition type ignition system utilizing the spark plug cap 1 of FIG. 1. Also shown is an example of the input section of a misfire detector.

Detection signals from a crankshaft sensor 11 and the like for detecting the operating state at the individual six cylinders of the internal combustion engine including its engine speed are forwarded to an engine control unit 12 which, in response, sends ignition signals to the power transistors 13A of a power transistor group 13. The power transistors 13A of the power transistor group 13 are for making and breaking the supply of primary current to the primary winding of the individual ignition coils 3B of the corresponding cylinders. The secondary winding of each ignition coil 3B is connected to the associated spark plug 2 through a diode 14 for suppressing or blocking reverse current flow. The conduction path between the spark plug 2 and the diode 14 includes the conductor 6 of the spark plug cap 1 shown in FIG. 1. As shown in FIG. 1, a part of the conductor 6 is surrounded by the conductor 8 so as to constitute the detection capacitor 9. The detection capacitor 9 is connected in series with a voltage divider capacitor 15 by the lead 10 shown in FIG. 1. The other terminal of the voltage divider capacitor 15 is grounded and an intermediate point between the detection capacitor 9 and the voltage divider capacitor 15 (the voltage division point) is connected with one terminal of an amplifier 17 on the input side of a misfire detector 16.

In the embodiment according to FIGS. 1 and 2, a high voltage is produced on the secondary winding of each ignition coil 3B every time an ignition signal from the engine control unit 12 causes the associated power transistor 13A of the power transistor group 13 to switch from the on state to the off state and thus cut off the supply of current to the primary winding of the ignition coil 3B. The current produced by this high voltage passes through the diode 14 serving as a reverse current suppression means to the spark plug 2 where it produces a spark discharge between the terminals of the spark plug 2. The voltage of the current flowing through the conductor 6 at this time is capacitively divided by the voltage divider capacitor 15 and the detection capacitor 9 constituted between the conductor 6 and the conductor 8 as shown in FIG. 1, and the capacitance divided voltage is applied as a detection voltage to the misfire detector 16. The misfire detector 16 compares the wave form of the detection voltage with a reference wave form for discriminating the presence/absence of misfire.

When normal combustion does not occur and ions are therefore not produced at the gap between the electrodes of the spark plug 2, then, during the latter half of the discharge period, a current tends to be produced in the opposite direction from the direction of the normal discharge current. However, since this reverse current (tending to flow from the spark plug 2 toward the ignition coil 3B) is suppressed by the diode 14 serving as the reverse current suppression means, there is no possibility of the ignition voltage being canceled out by the reverse current. Thus, since there is no possibility of the wave form of the ignition voltage being disturbed by any such reverse current, accurate discrimination of the presence/absence of misfire is ensured at all times.

Moreover, in the embodiment, since the spark plug cap 1 is fixed on the spark plug 2 so as to cover its terminal portion and the spark plug is screwed firmly into the head of the internal combustion engine, there is little likelihood of the spark plug cap vibrating. Moreover, since the conductor 8 for detection is formed integrally with the spark plug cap insulation 4, any vibration it does receive will not shift its position or deform it. In addition, since the conductor 8 for detection is located inside the spark plug cap, it is isolated from changes in humidity and other ambient conditions and is also safe from the invasion of oil, grime and the like from the outside.

For enhancing the accuracy of voltage wave form detection, it is preferable to maximize the static capacitance of the detection capacitor 9 by reducing as far as possible the distance D between the conductor 8 and the conductor 6 constituting the detection capacitor 9. However, reducing the distance D too far may lead to degradation of the insulation property by corona discharge and to lowering of the insulation breakdown voltage and, therefore, may result in a high leak voltage being applied to the misfire detector through the conductor 8.

This problem is overcome by the second embodiment of the invention, which will now be explained, with reference to FIG. 3, as utilized in the spark plug cap 1 of the direct ignition type ignition system.

Figure 3:
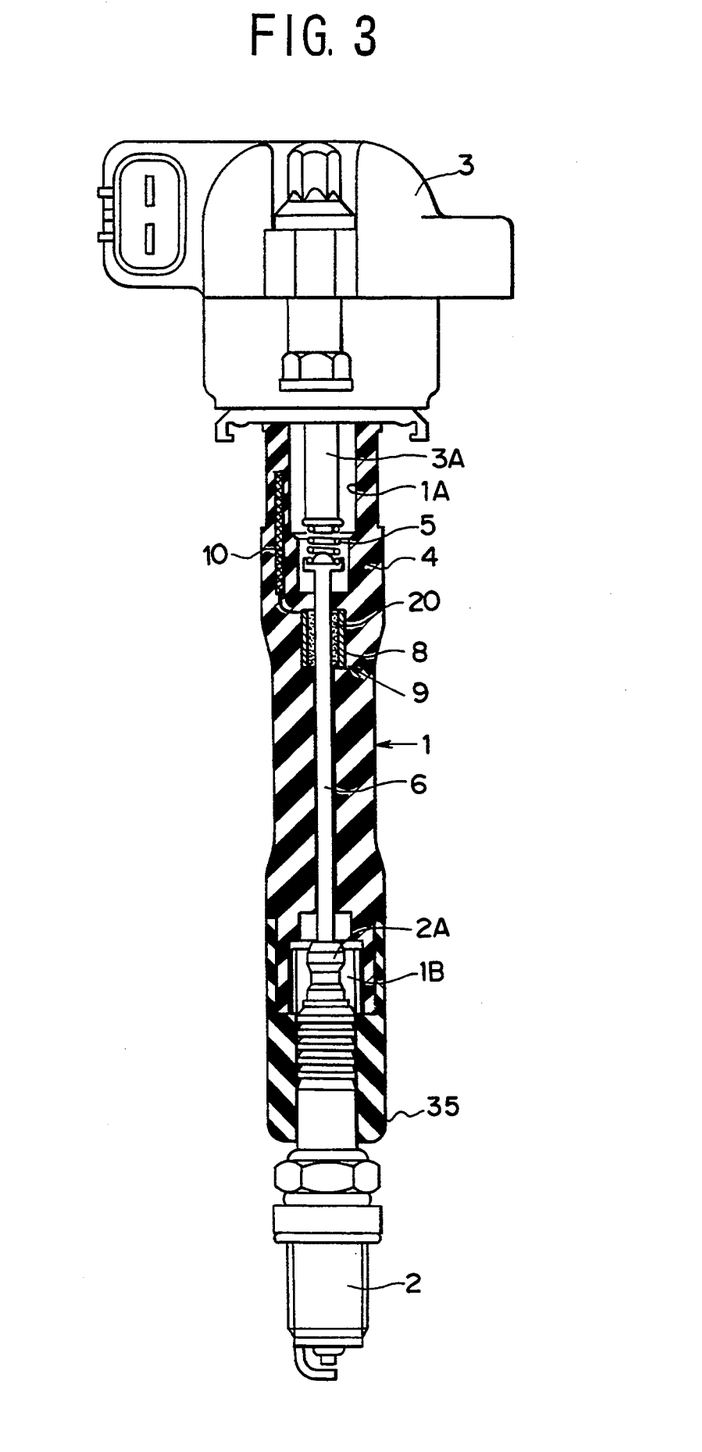
FIG. 3 is a side view partially in section of a spark plug cap with a misfire detecting capacitor according to a second embodiment of the invention.

Aside from being provided with a ceramic insulator layer 20 on the inner surface of the conductor 8, the embodiment of FIG. 3 is exactly the same as the embodiment of FIG. 1.

In the embodiment of FIG. 3, since as the ceramic disposed between the inner surface of the conductor 8 and the conductor 6 there is selected one which has low susceptibility to insulation property degradation by corona discharge, high breakdown voltage and excellent insulation characteristics, it is possible to achieve a large static capacitance by reducing the distance D while simultaneously enhancing the insulation performance so as prevent leak voltages from reaching the misfire detector.

Figure 4:
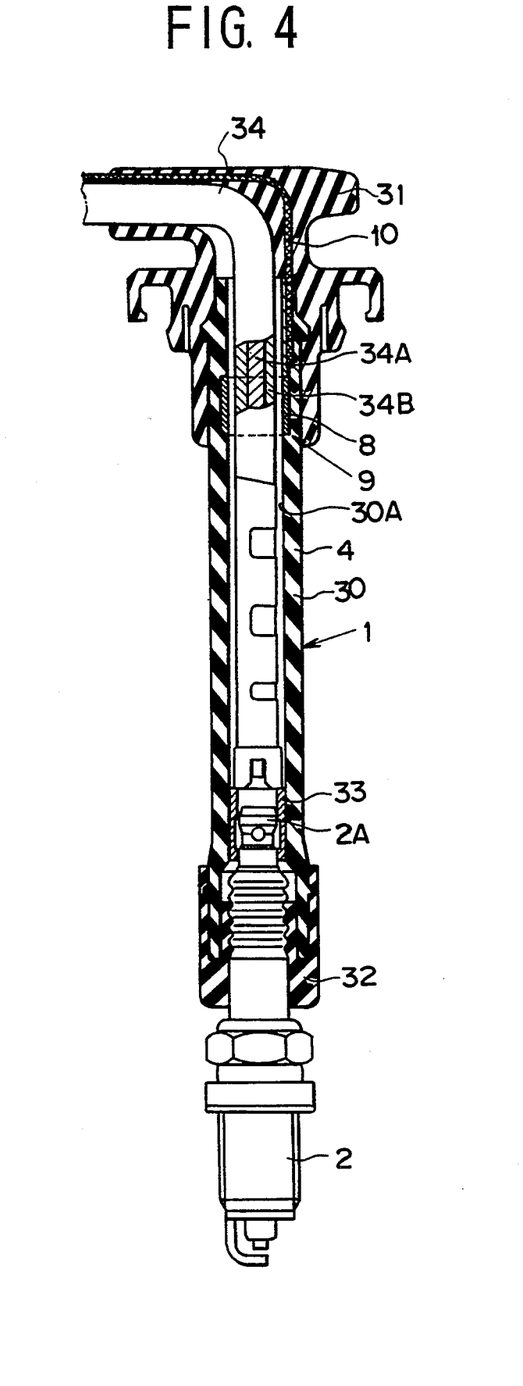
FIG. 4 is vertical sectional view of a spark plug with a misfire detecting capacitor according to a third embodiment of the invention.

FIG. 4 shows a third embodiment of the invention in which a spark plug cap is applied to an ignition system employing an ignition distributor.

In the embodiment of FIG. 4, the spark plug cap 1 comprises a hollow cylindrical cap body 30, an upper cover 31 fitted over the top end of the cap body 30, a lower cover 32 fitted over the bottom end of the cap body 30, and a connector 33 provided inside the bottom end of the cap body 30. The cap body 30 is formed of a hard resin such as PBT or unsaturated polyester. As in the earlier embodiments, it constitutes an insulator 4. The upper cover 31 and the lower cover 32 are formed of a relatively soft insulator material such as rubber. A high-voltage cable 34 from an ignition distributor (not shown) passes through the hollow center of the upper cover 31 and into the hollow center 30A of the cap body 30 from the top end thereof. The free end of the high-voltage cable 34 is electrically connected to the connector 33. The terminal 2A of the spark plug 2 is inserted through the lower cover 32 and into the lower end of the hollow center of the cap body 30. The terminal 2A is electrically connected with the high-voltage cable 34 through the connector 33. Owing to this arrangement, the high-voltage current flowing through the conductive core 34A inside the insulator 34B high-voltage cable 34 is conducted to the terminal 2A of the spark plug 2 through the interior of the cap body 30 constituting the insulator 4. In other words, the conductive core 34A inside the high-voltage cable 34 corresponds to the conductor 6 for high-voltage conduction in the embodiments of FIGS. 1 and 3.

In addition to the features described in the foregoing, which are the same as those of the prior art spark plug cap, the embodiment of FIG. 4 is further provided on the inner surface of the upper end of the cap body 30 with the conductor 8 for detection constituted in the shape of a hollow tube, a half tube(s) or a split tube(s). The conductor 8 and the conductive core 34A inside the high-voltage cable 34 constitute the detection capacitor 9. The lead 10 is connected with the conductor 8 for enabling the detection voltage to be conducted to the exterior.

Figure 5:
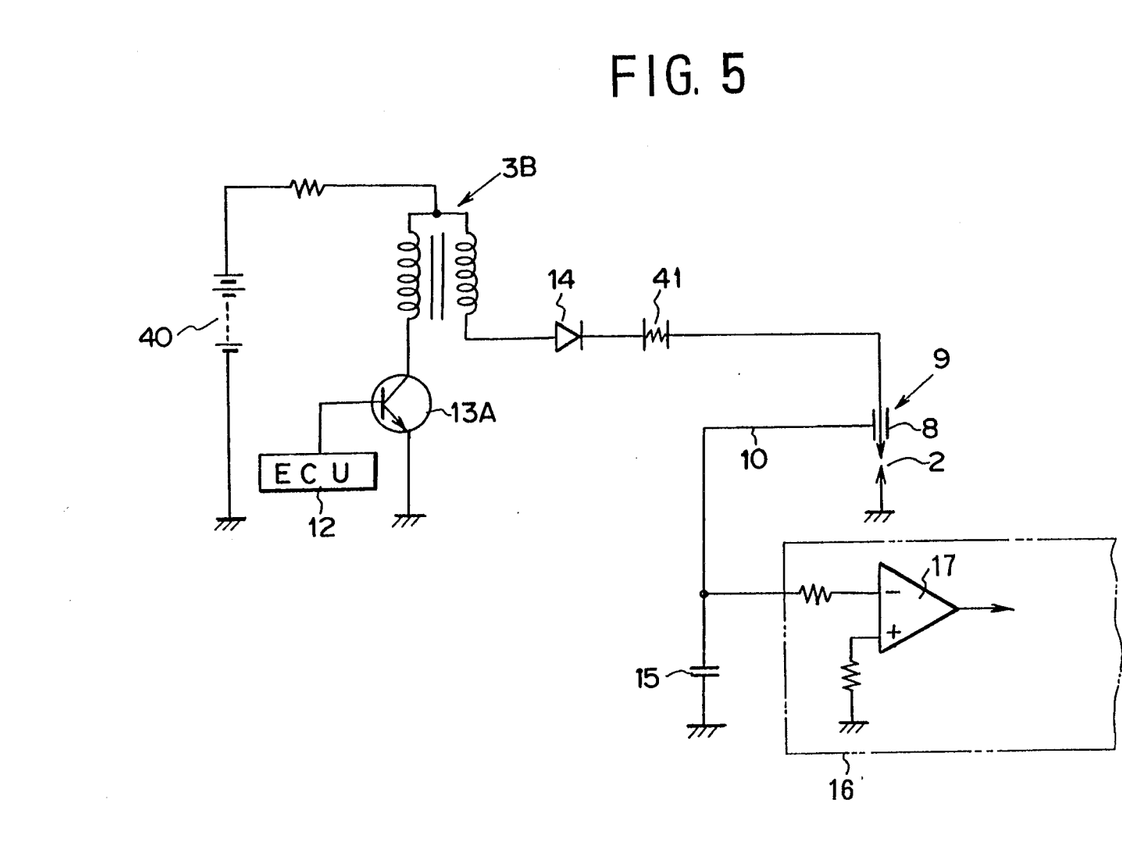
FIG. 5 is a wiring diagram showing the electrical circuitry of an ignition system utilizing the spark plug cap of FIG. 4.

FIG. 5 is a schematic diagram of the electric circuitry of an ignition system utilizing the spark plug cap 1 of FIG. 4. Also shown is an example of the input section of a misfire detector.

In FIG. 5, current flowing from a battery 40 through the primary winding of the ignition coil 3B is turned on and off by the power transistor 13A in response to ignition signals from the engine control unit 12. The high-voltage current induced in the secondary winding of the ignition coil 3B passes through the power diode 14 serving as the reverse current suppression means to the spark plug 2. Inside the spark plug cap 1, the conductive core 34A (the conductor for high-voltage conduction) and the conductor 8 enclosing the high-voltage cable 34 form the detection capacitor 9, as was shown in FIG. 4. As in the case of the embodiment of FIG. 2, the detection capacitor 9 is connected in series with the voltage divider capacitor 15 by the lead 10. The other terminal of the voltage divider capacitor 15 is grounded and an intermediate point between the detection capacitor 9 and the voltage divider capacitor 15 (the voltage division point) is connected with one terminal of the amplifier 17 on the input side of the misfire detector 16.

In the embodiment of FIGS. 4 and 5, the voltage of the current flowing through the conductive core 34A (the conductor for high-voltage conduction) of the high-voltage cable 34 in the spark plug cap 1 is capacitively divided by the voltage divider capacitor 15 and the detection capacitor 9 constituted between the conductive core 34A and the conductor 8 as shown in FIG. 4 and the capacitance divided voltage is applied as a detection voltage to the misfire detector 16. The misfire detector 16 compares the wave form of the detection voltage with a reference wave form for discriminating the presence/absence of misfire.

Figure 6:
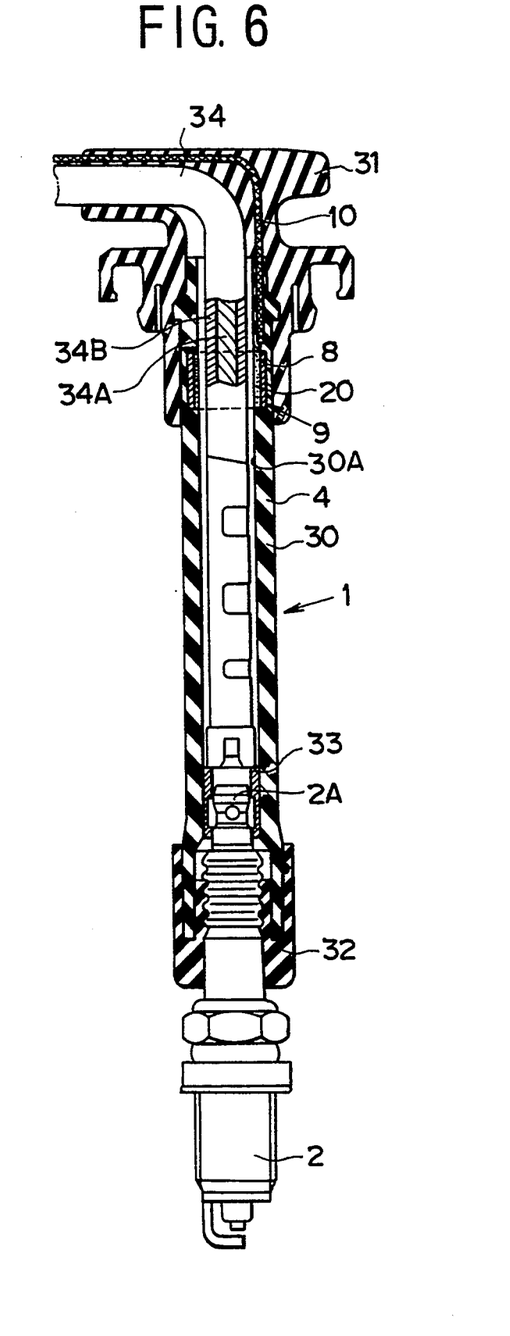
FIG. 6 is a vertical sectional view of a spark plug cap with a misfire detecting capacitor according to a fourth embodiment of the invention.

FIG. 6 shows a fourth embodiment of the spark plug cap configuration according to the invention for use in the direct ignition type ignition system. Aside from being provided with the ceramic insulator layer 20 on the inner surface of the conductor 8, the embodiment of FIG. 6 is exactly the same as the embodiment of FIG. 4. As was shown in FIG. 5, in the direct ignition type ignition system spark plug cap provided with the conductor 8 but not provided on the inner surface of the conductor 8 with the ceramic insulator layer 20, the only material present between the conductive core 34A (the conductor for high-voltage conduction) of the high-voltage cable 34 and the conductor 8 is the synthetic rubber insulator cladding 34B of the high-voltage cable 34. The insulation characteristics in this case are not completely satisfactory. On the other hand, when the ceramic insulator layer 20 is provided as shown in FIG. 6, the fact that the ceramic itself has extremely good insulation properties ensures that, similarly to what was explained with regard to the embodiment of FIG. 3, there will be no danger of degradation of the insulation characteristics by corona discharge or the like.

The present invention has thus been shown and described with reference to the specific embodiments. However, it should be noted that the present invention is in no way limited to the details of the described arrangements, changes and modifications may be made without departing from the scope of the appended claims.

What is claimed is:

1. A spark plug cap for engaging and covering a terminal of a spark plug for an internal combustion engine, said spark plug cap comprising:

a first conductor selectively electrically connected to an ignition coil and to the spark plug terminal for carrying ignition voltage current from the ignition coil to the spark plug terminal, to thereby generate an electric spark between spark plug electrodes; and an insulator surrounding the first conductor;

a second conductor radially located around a portion of the first conductor, wherein a predetermined distance is maintained from the first conductor such that a capacitor, which constitutes a capacitive divider with a capacitor for ignition voltage detection, is formed with the first and the second conductors, wherein the first conductor, a portion of the insulator, and the second conductor are integrated in a cap portion of said spark plug cap, and wherein said cap portion is configured to engage and cover the terminal of the spark plug at a distal end of the first conductor to provide the electrical connection of the first conductor to the spark plug terminal.

2. A spark plug cap according to claim 1, wherein the first conductor is a metal shaft and the insulator is made from a hard plastic.

3. A spark plug cap according to claim 2, wherein the cap carries the ignition coil and the metal shaft conductor is connected to the terminal of the secondary winding of the ignition coil.

4. A spark plug cap according to claim 2, wherein the insulator serves as a housing of the cap.

5. A spark plug cap according to claim 2, wherein the hard plastic is a saturated polyester resin.

6. A spark plug cap according to claim 1, wherein the first conductor is a cable core and the insulator is a synthetic rubber wrapping the cable core.

7. A spark plug cap according to claim 1, wherein the second conductor is a metal tube encircling the first conductor.

8. A spark plug cap according to claim 1, wherein the second conductor is metal tube segments encircling the conductor.

9. A spark plug cap for engaging and covering a terminal of a spark plug for an internal combustion engine, said spark plug cap comprising:

a first conductor selectively electrically connected to an ignition coil and the spark plug terminal for carrying high ignition voltage current from the ignition coil to the spark plug terminal to thereby generate an electric spark between spark plug electrodes; and a first insulator surrounding the first conductor;

a second conductor radially located around a portion of the first conductor, wherein a predetermined distance is maintained from the first conductor; and a second insulator provided between the first and the second conductors such that a capacitor, which constitutes a capacitance divider with a capacitor for ignition voltage detection, is formed with the first and the second conductors, wherein the first conductor, the second insulator, and the second conductor are integrated in a cap portion of said spark plug cap, and wherein the cap portion is configured to engage and cover the terminal of the spark plug at a distal end of the first conductor to provide the electrical connection of the first conductor to the spark plug terminal.

10. A spark plug cap according to claim 9, wherein the second insulator is made of a material having high insulation property.

11. A spark plug cap according to claim 10, wherein the material is a ceramic.

12. A spark plug cap according to claim 9, wherein the first conductor is a metal shaft and the first insulator is made of a hard plastic.

13. A spark plug cap according to claim 12, wherein the cap carries the ignition coil and the metal shaft conductor is connected to the terminal of the secondary winding of the ignition coil.

14. A spark plug cap according to claim 12, wherein the first insulator serves as a housing of the cap.

15. A spark plug cap according to claim 12, wherein the hard plastic is a saturated polyester resin.

16. A spark plug cap according to claim 9, wherein the first conductor is a cable core and the first insulator is a synthetic rubber wrapping the cable core.

17. A spark plug cap according to claim 9, wherein the second conductor is a metal tube encircling the first conductor.

18. A spark plug cap according to claim 9, wherein the second conductor is metal tube segments encircling the first conductor.

* * * * *